United States Patent
Ryoki et al.

(10) Patent No.: US 12,332,190 B2
(45) Date of Patent: Jun. 17, 2025

(54) RADIATION DETECTOR, RADIATION DETECTION SYSTEM, AND RADIATION CT APPARATUS

(71) Applicant: CANON KABUSHIKI KAISHA, Tokyo (JP)

(72) Inventors: Tatsuya Ryoki, Kanagawa (JP); Takanori Yamashita, Tokyo (JP); Masanobu Ohmura, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 276 days.

(21) Appl. No.: 18/297,178

(22) Filed: Apr. 7, 2023

(65) Prior Publication Data

US 2024/0302298 A1    Sep. 12, 2024

(30) Foreign Application Priority Data

Mar. 7, 2023 (JP) ................. 2023-034934

(51) Int. Cl.
*G01N 23/046* (2018.01)
*G01T 1/24* (2006.01)
*H10F 30/29* (2025.01)

(52) U.S. Cl.
CPC ........... *G01N 23/046* (2013.01); *G01T 1/247* (2013.01); *H10F 30/29* (2025.01)

(58) Field of Classification Search
CPC ........ G01N 23/046; G01T 1/247; H10F 30/29
See application file for complete search history.

(56) References Cited

U.S. PATENT DOCUMENTS

| | | | |
|---|---|---|---|
| 5,982,848 A | * | 11/1999 | Friedrich ............... H05G 1/44 378/96 |
| 10,115,695 B1 | | 10/2018 | Motoyoshi |
| 11,067,707 B2 | | 7/2021 | Crestani |

(Continued)

FOREIGN PATENT DOCUMENTS

| JP | 2015-133408 A | 7/2015 |
|---|---|---|
| JP | 2015-141037 A | 8/2015 |
| JP | 2018-190775 A | 11/2018 |

OTHER PUBLICATIONS

U.S. Appl. No. 18/194,719, Takanori Yamashita, filed Apr. 3, 2023.

*Primary Examiner* — Blake C Riddick
(74) *Attorney, Agent, or Firm* — VENABLE LLP

(57) ABSTRACT

A radiation detector comprising a radiation sensor obtained by arranging first electrodes on a semiconductor substrate configured to convert incident radiation into charges, an integrated circuit, and an interposer is provided. The interposer comprises first terminals arranged on a first surface facing the sensor and connected to the first electrodes, and second terminals arranged on a second surface facing the integrated circuit and connected to the integrated circuit. Each of the first terminals is connected to one second terminal. The number of the second terminals is smaller than the first terminals. The substrate comprises a third surface on which the first electrodes are arranged and a fourth surface on which second electrodes are arranged. The detector further comprises a selector configured to select the second electrode from the second electrodes to supply a potential for converting the incident radiation into charges.

14 Claims, 7 Drawing Sheets

(56) References Cited

U.S. PATENT DOCUMENTS

| | | | | |
|---|---|---|---|---|
| 2009/0009644 | A1* | 1/2009 | Kitani | H04N 25/00 348/222.1 |
| 2009/0261265 | A1* | 10/2009 | Hahn | G01T 1/2935 250/382 |
| 2012/0057014 | A1* | 3/2012 | Takayama | H04N 25/48 348/79 |
| 2012/0228486 | A1* | 9/2012 | Herrmann | G01T 7/005 250/252.1 |
| 2013/0264722 | A1* | 10/2013 | Okada | H01L 24/97 257/777 |
| 2014/0334601 | A1* | 11/2014 | Shizukuishi | H10F 39/1895 378/62 |
| 2015/0131776 | A1* | 5/2015 | Cho | A61B 6/42 250/336.1 |
| 2015/0200323 | A1 | 7/2015 | Doki | |
| 2016/0301890 | A1* | 10/2016 | Kurokawa | H10F 39/80377 |
| 2017/0092385 | A1* | 3/2017 | Cabauy | H10F 30/29 |
| 2017/0192110 | A1* | 7/2017 | Steadman Booker | G01T 1/247 |
| 2018/0108446 | A1* | 4/2018 | Cabauy | H10F 77/1248 |
| 2019/0094393 | A1* | 3/2019 | Cao | A61B 6/032 |
| 2019/0339402 | A1* | 11/2019 | Crestani | G01T 1/243 |
| 2020/0209415 | A1* | 7/2020 | Veale | G01T 1/241 |
| 2020/0279666 | A1* | 9/2020 | Cabauy | H10F 77/1248 |
| 2021/0173104 | A1* | 6/2021 | Cao | G01V 5/226 |
| 2022/0165641 | A1* | 5/2022 | Nakayama | H01L 23/10 |
| 2022/0276184 | A1* | 9/2022 | Marthandam | A61B 6/032 |
| 2022/0381617 | A1* | 12/2022 | Wakabayashi | H10F 77/60 |
| 2023/0022940 | A1* | 1/2023 | Taguchi | G01J 5/061 |
| 2023/0048566 | A1* | 2/2023 | Wakabayashi | H10F 30/223 |
| 2023/0071949 | A1* | 3/2023 | Suzuki | H10F 39/804 |
| 2023/0132059 | A1* | 4/2023 | Kurokawa | G06N 3/048 257/40 |
| 2024/0055461 | A1* | 2/2024 | Yanagawa | H10F 39/024 |
| 2024/0055464 | A1* | 2/2024 | García González | A61B 6/4233 |
| 2024/0230932 | A9* | 7/2024 | Ayukawa | G01T 1/244 |

* cited by examiner

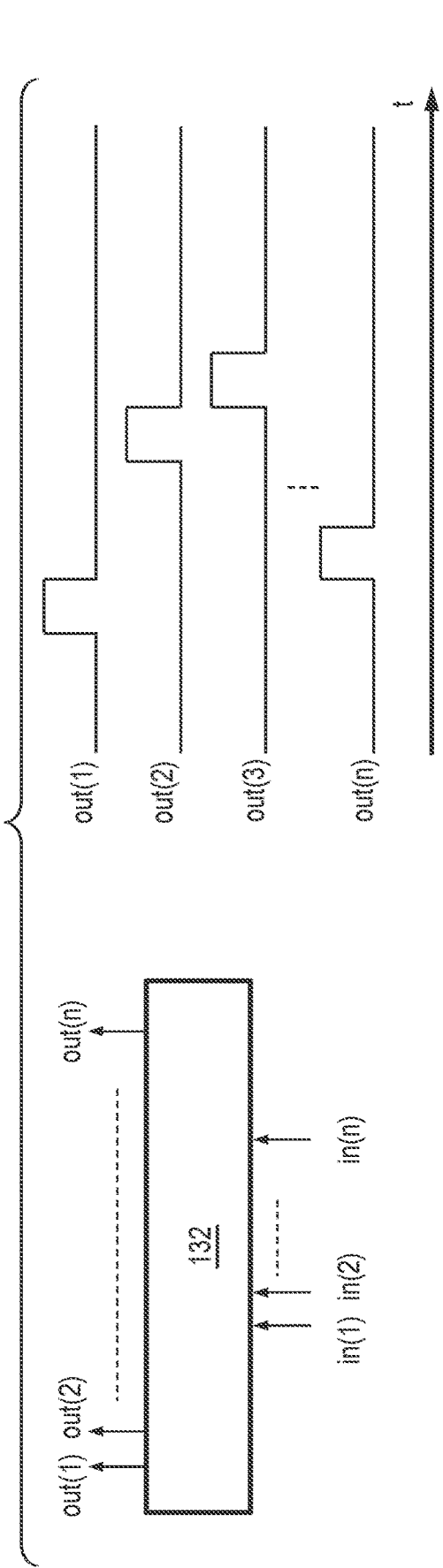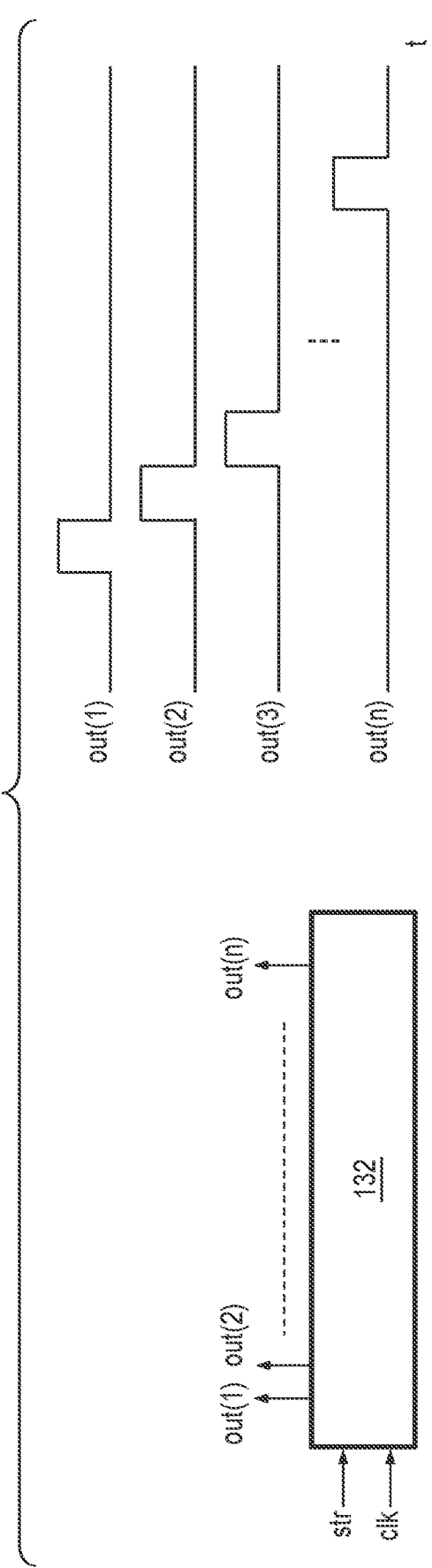

RADIATION DETECTOR, RADIATION DETECTION SYSTEM, AND RADIATION CT APPARATUS

BACKGROUND OF THE INVENTION

Field of the Invention

The present invention relates to a radiation detector, a radiation detection system, and a radiation CT apparatus.

Description of the Related Art

There is known that a semiconductor substrate which converts incident radiation into charges is used for a radiation detector. U.S. patent Ser. No. 11/067,707 describes that a radiation sensor made of a semiconductor such as cadmium zinc telluride and an application specific integrated circuit (ASIC) are connected via an interposer.

As the number of pixels (electrodes) of the radiation sensor increases, the number of input/output terminals of the interposer that connects the radiation sensor and the ASIC increases. If the number of terminals of the interposer increases, the area of a region where the terminals are arranged increases, thereby increasing the chip size of the ASIC. As a result, the radiation detector becomes large in size.

Some embodiments of the present invention provide a technique advantageous in suppressing an increase in the size of a radiation detector.

SUMMARY OF THE INVENTION

According to some embodiment, a radiation detector comprising: a radiation sensor obtained by arranging, on a semiconductor substrate configured to convert incident radiation into charges, a plurality of pixels each including a first electrode; an integrated circuit configured to process a signal output from the radiation sensor; and an interposer configured to electrically connect the radiation sensor and the integrated circuit, wherein the interposer comprises a plurality of first terminals arranged on a first surface of the interposer facing the radiation sensor and electrically connected to the first electrodes of the plurality of pixels, and a plurality of second terminals arranged on a second surface of the interposer facing the integrated circuit and connected to the integrated circuit, each of the plurality of first terminals is connected to one second terminal among the plurality of second terminals, the number of the plurality of second terminals is smaller than the number of the plurality of first terminals, the semiconductor substrate comprises a third surface which faces the interposer and on which the first electrodes of the plurality of pixels are arranged, and a fourth surface on an opposite side of the third surface, on which a plurality of second electrodes are arranged, and the radiation detector further comprises a selection circuit configured to select, from the plurality of second electrodes, the second electrode to supply a potential for converting the incident radiation into charges, is provided.

Further features of the present invention will become apparent from the following description of exemplary embodiments (with reference to the attached drawings).

BRIEF DESCRIPTION OF THE DRAWINGS

FIGS. 5A and 5B are views each showing an example of the arrangement of a selection circuit of the radiation detection system shown in FIG. 4;

DESCRIPTION OF THE EMBODIMENTS

Figure 1:
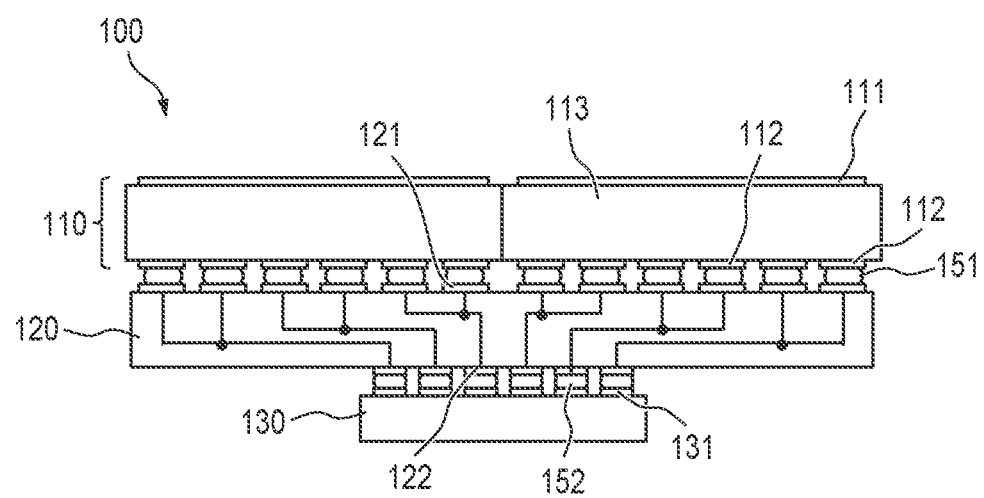
FIG. 1 is a view showing an example of the arrangement of a radiation detector according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Radiation according to the present invention can include not only α-rays, β-rays, and γ-rays that are beams generated by particles (including photons) emitted by radioactive decay but also beams having equal or more energy, for example, X-rays, particle rays, and cosmic rays.

A radiation detector according to an embodiment of the present invention will be described with reference to FIGS. 1 to 8. FIG. 1 is a view showing an example of the arrangement of a radiation detector 100 according to this embodiment. The radiation detector 100 includes a radiation sensor 110, an integrated circuit 130, and an interposer 120.

In the radiation sensor 110, a plurality of pixels are arranged on a semiconductor substrate 113 that converts incident radiation into charges. The semiconductor substrate 113 is made of a single crystal of a cadmium-zinc-telluride (CdZnTe ($Cd_{1-x}Zn_xTe$) (x is, for example, 0.5 or less)) semiconductor as an alloy of cadmium telluride (CdTe) and zinc telluride (ZnTe), or the like. The $Cd_{1-x}Zn_xTe$ semiconductor is also called CZT. Note that this embodiment will mainly explain CZT but the present invention is not limited to this and can be applied to a semiconductor single crystal substrate that can directly detect radiation such as X-rays. For example, this embodiment can be applied to a semiconductor single crystal substrate of cadmium telluride (CdTe), lead iodide ($PbI_2$), mercury iodide ($HgI_2$), bismuth iodide ($BiI_3$), or thallium bromide (TlBr). A plurality of electrodes 112 are arranged on one of two principal surfaces of the semiconductor substrate 113, and an electrode 111 is arranged on the other principal surface. By arranging the electrodes 112, the position of each pixel of the radiation sensor 110 can be confirmed. The electrode 111 may be integrated, as shown in FIG. 1, or may be divided into a plurality of electrodes. The arrangement of the electrode 111 will be described later. FIG. 1 shows a section when two radiation sensors 110 are arranged.

The integrated circuit 130 processes a signal output from each radiation sensor 110. The integrated circuit 130 is, for example, a semiconductor device such as an ASIC (Application Specific Integrated Circuit).

The interposer 120 electrically connects each radiation sensor 110 and the integrated circuit 130. The interposer 120 includes a plurality of terminals 121 and a plurality of terminals 122. The plurality of terminals 121 are arranged on the surface of the interposer 120 facing the radiation sensors 110, and are electrically connected to the electrodes 112 of the plurality of pixels of the radiation sensors 110. More specifically, each of the plurality of terminals 121 is connected, via a bump 151 such as a solder ball, to each of the plurality of terminals 112 arranged in the radiation sensors 110. The plurality of terminals 122 are arranged on the surface of the interposer 120 facing the integrated circuit 130, and connected to the integrated circuit 130. More specifically, each of the plurality of terminals 122 is connected, via a bump 152 such as a solder ball, to each of a plurality of terminals 131 arranged in the integrated circuit 130.

As shown in FIG. 1, each of the plurality of terminals 121 connected to the radiation sensors 110 is connected to one of the plurality of terminals 122 connected to the integrated circuit 130. In this example, the number of the plurality of terminals 122 is smaller than the number of the plurality of terminals 121. For example, as shown in FIG. 1, each of the plurality of terminals 122 may be connected to two or more of the plurality of terminals 121. However, the present invention is not limited to this, and each of some of the plurality of terminals 122 may be connected to two or more terminals 121 and each of the remaining terminals 122 may be connected to one terminal 121. That is, as described above, the number of the plurality of terminals 122 need only be smaller than the number of the plurality of terminals 121.

Two or more of the plurality of terminals 121 are short-circuited in the interposer 120. This can suppress an increase in the number of wiring patterns in the interposer 120, as compared with a case in which the plurality of terminals 121 and the plurality of terminals 122 are connected in one-to-one correspondence. By suppressing an increase in the number of wiring patterns in the interposer 120, the number of wiring layers in the interposer 120 is suppressed, thereby suppressing an increase in the thickness of the interposer 120. Furthermore, since an increase in the number of terminals of the interposer 120 with respect to the integrated circuit 130 can be suppressed, an increase in the chip size of the integrated circuit 130 can be suppressed. That is, by suppressing an increase in the thickness of the interposer 120 and an increase in the chip size of the integrated circuit 130, it is possible to suppress an increase in the size of the radiation detector 100.

Figure 2A:
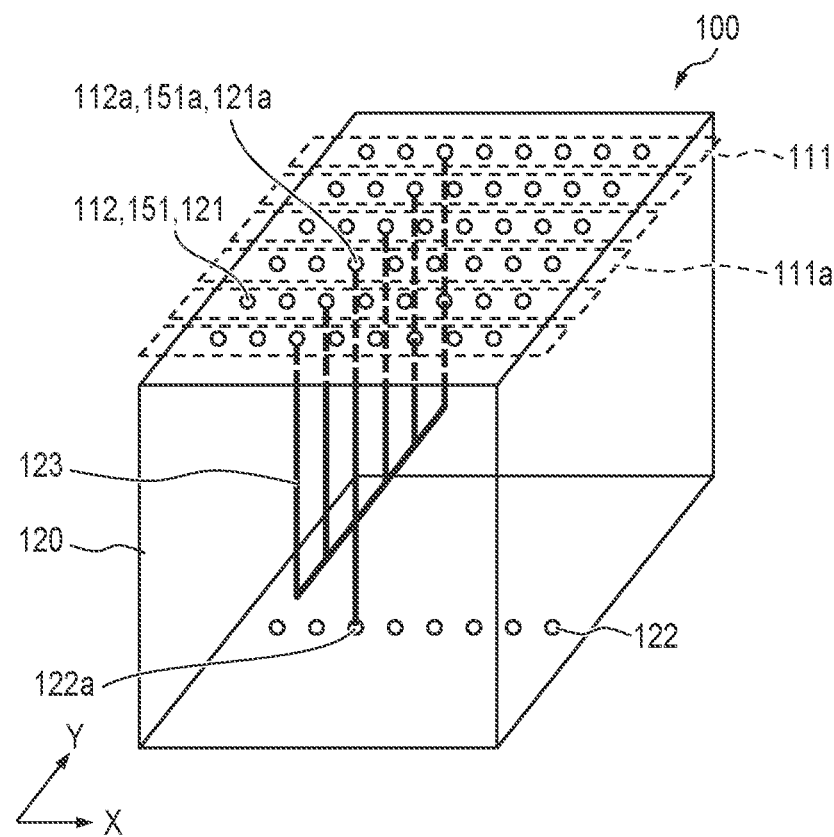
FIGS. 2A and 2B are views showing an example of the arrangement of an interposer of the radiation detector shown in FIG. 1.
Figure 2B:
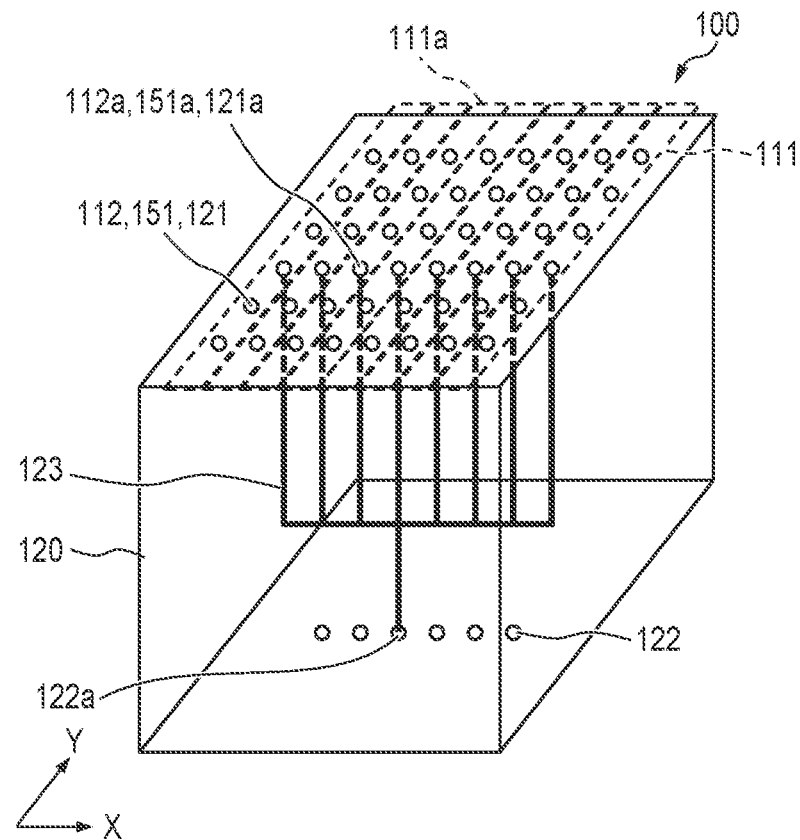

Next, the operation of the radiation detector 100 according to this embodiment will be described. FIGS. 2A and 2B show only some components of the radiation detector 100 to show a wiring pattern in the interposer 120. More specifically, FIGS. 2A and 2B show the shapes and arrangement positions of the electrodes 111 of the radiation sensor 110 with respect to the terminals 121 (the bumps 151 and the electrodes 112 of the radiation sensor 110 are arranged at the same positions) of the interposer 120, and a wiring pattern 123 that connects the terminals 121 and 122. To avoid the view from becoming complicated, only the wiring pattern 123 that is connected to a terminal 122a among the plurality of terminals 122 is shown. However, the wiring pattern 123 for connecting the terminals 121 to each terminal 122 is similarly arranged. The same applies to the remaining drawings.

As shown in FIG. 1, the semiconductor substrate 113 includes a surface which faces the interposer 120 and on which the plurality of electrodes 112 are arranged, and a surface on the opposite side of the surface on which the electrodes 112 are arranged, on which the plurality of electrodes 111 are arranged. As shown in FIGS. 2A and 2B, the plurality of electrodes 112 can be arranged in an array to form rows and columns. At this time, the plurality of terminals 121 of the interposer 120 include a plurality of terminals 121 each connected to each of two or more electrodes 112 arranged in the row direction among the plurality of electrodes 112. The row direction is the Y direction in FIG. 2A, and is the X direction in FIG. 2B.

The plurality of terminals 121 including a terminal 121a connected to an electrode 112a are connected to the one terminal 122a among the plurality of terminals 122 via the wiring pattern 123. At this time, in orthogonal projection to the surface on which the electrodes 111 of the radiation sensor 110 are arranged, the two or more electrodes 112 including the electrode 112a short-circuited by the wiring pattern 123 in the interposer 120 are arranged to overlap different electrodes 111 among the plurality of electrodes 111.

For example, as shown in FIGS. 2A and 2B, the plurality of terminals 121 may be connected to the electrodes 112 forming one row among the plurality of electrodes 112. In this case, in orthogonal projection to the surface on which the electrodes 111 of the radiation sensor 110 are arranged, each of the plurality of electrodes 111 may be arranged to overlap the electrodes 112 forming one column among the plurality of electrodes 112. The column direction is the X direction in FIG. 2A, and is the Y direction in FIG. 2B. This embodiment assumes that the direction in which the electrode 111 extends is the "column" direction, but the direction in which the electrode 111 extends may be set as the "row" direction to interchange the "column" direction and the "row" direction.

Consider, for example, a case in which a signal of a pixel whose position is defined by the electrode 112a shown in FIGS. 2A and 2B in the radiation sensor 110 is read out. In this case, by applying a voltage between the electrode 112a and the electrode 111a among the plurality of electrodes 111, a signal can be read out. That is, a signal can be read out for each of the pixels arranged in the column direction among the plurality of pixels arranged in the radiation sensor 110.

Figure 3:
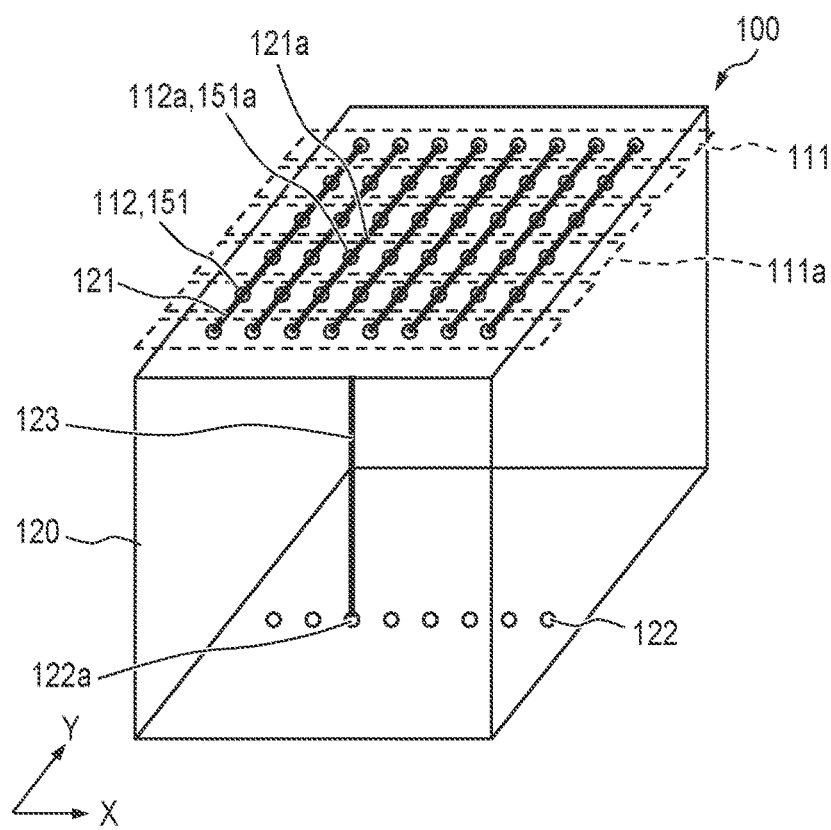
FIG. 3 is a view showing an example of the arrangement of the interposer of the radiation detector shown in FIG. 1.

In the arrangement shown in FIGS. 2A and 2B, the terminals 121 are arranged to correspond to the electrodes 112 arranged in the radiation sensor 110, respectively. The present invention, however, is not limited to this. As shown in FIG. 3, the terminal 121 may be one terminal connected to two or more electrodes 112 arranged in the row direction among the plurality of electrodes 112 arranged in the radiation sensor 110. For example, the terminal 121 may be a strip-shaped terminal connected to the electrodes 112 forming one row among the plurality of electrodes 112. When one terminal 121 is connected to the plurality of electrodes 112 arranged in the radiation sensor 110, it is possible to further decrease the number of wiring patterns 123 in the interposer 120, thereby thinning the interposer 120.

Figure 4:
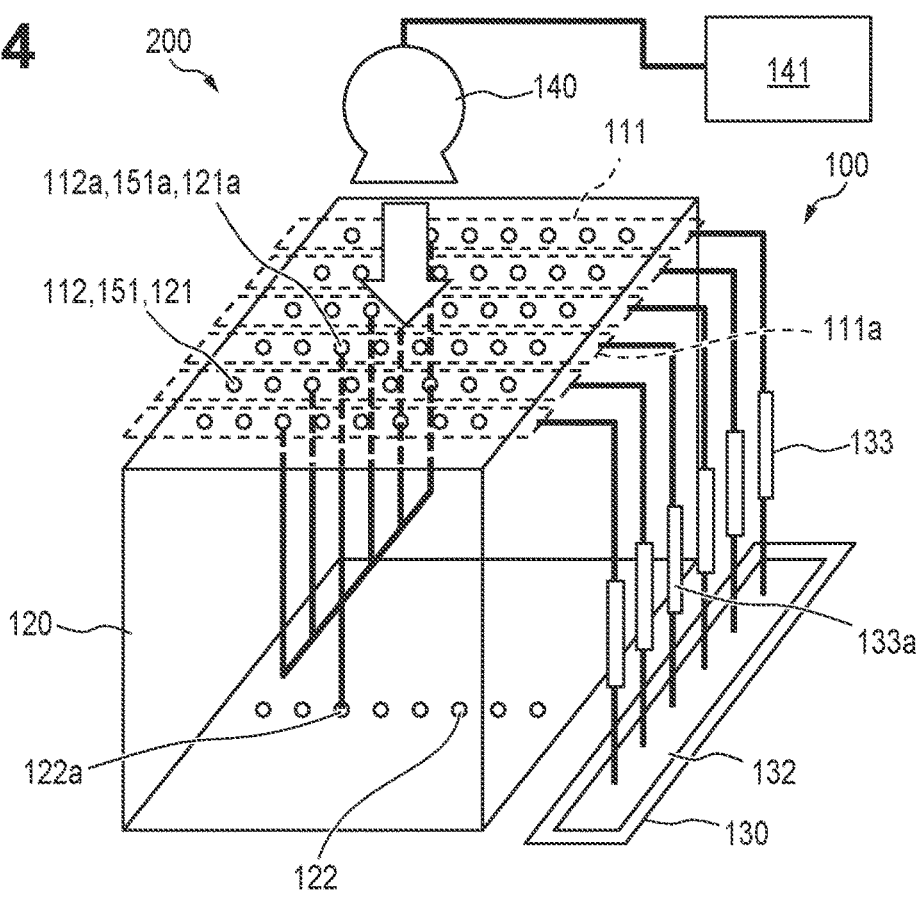
FIG. 4 is a view showing an example of the arrangement of a radiation detection system using the radiation detector shown in FIG. 1.

FIG. 4 is a view showing an example of the arrangement of a radiation detection system 200 including the radiation detector 100, a radiation generation unit 140 that radiates the radiation detector 100 with radiation, and an irradiation control unit 141 that controls the radiation generation unit 140. The radiation detector 100 may further include a selection circuit 132 that selects, among the plurality of electrodes 111, the electrode 111 to supply a potential for converting the incident radiation into charges. The selection circuit 132 may be arranged in the integrated circuit 130, as shown in FIG. 4, or may be arranged separately from the integrated circuit 130. When the selection circuit 132 appropriately activates a power supply circuit 133 connected to the electrode 111, the electrode 111 to supply a potential is selected.

For example, as shown in FIG. 5A, the selection circuit 132 may be a decoder circuit that activates a corresponding output out with respect to an input in. Alternatively, for example, as shown in FIG. 5B, the selection circuit 132 may be a shift register circuit that starts an operation by a start signal str, and sequentially activates the output out in accordance with a clock signal clk.

With the above arrangement, the electrode 111 to supply the potential for converting the incident radiation into charges can be selected from the plurality of electrodes 111. While the radiation generation unit 140 emits radiation, the plurality of electrodes 111 may be sequentially scanned, thereby reading out signals from the plurality of pixels arranged in the radiation sensor 110.

For example, the irradiation control unit 141 of the radiation detection system 200 may control the radiation generation unit 140 to irradiate, with radiation, a position corresponding to the electrode 111 selected by the selection circuit 132 from the plurality of electrodes 111 and supplied with the potential. For example, when the irradiation control unit 141 can control a radiation irradiation position by controlling the operation of a collimator arranged in the radiation generation unit 140 and formed from a lead plate for narrowing the radiation irradiation range. If, for example, the selection circuit 132 selects a power supply circuit 133a among the power supply circuits 133, and the potential is supplied to the electrode 111a, the irradiation control unit 141 controls the collimator so that the radiation generation unit 140 irradiates, with radiation, the position at which the electrode 111a is arranged.

Figure 6:
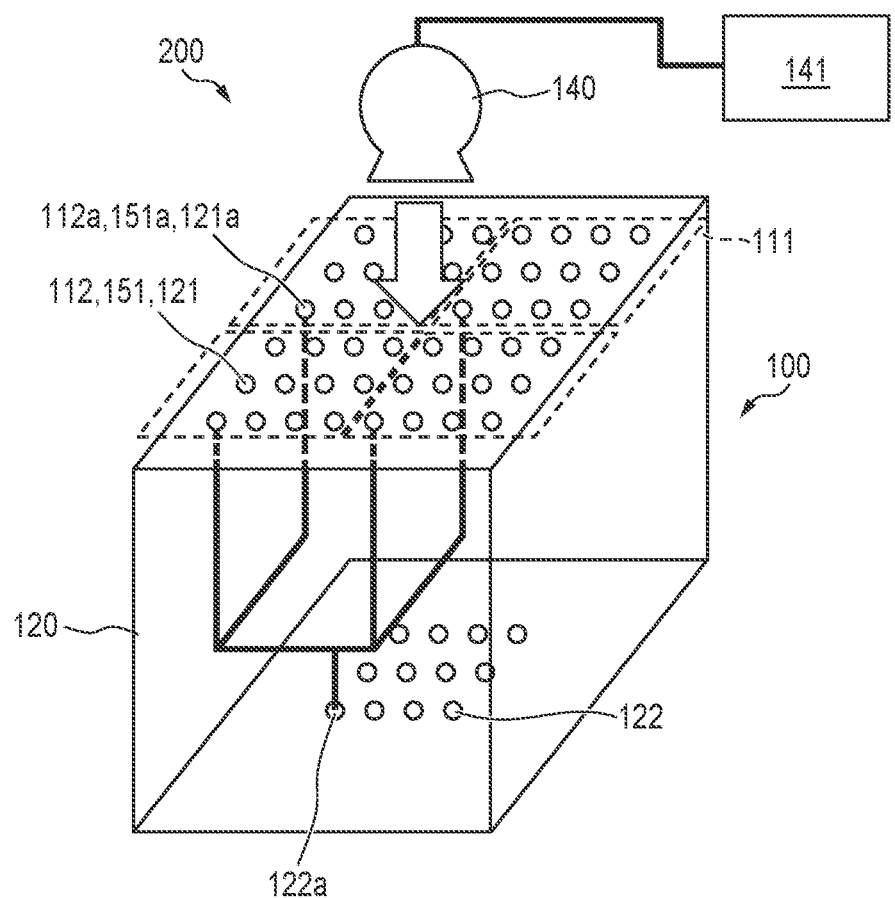
FIG. 6 is a view showing a modification of the radiation detection system shown in FIG. 4.

FIG. 6 is a view showing a modification of the radiation detection system 200 and the radiation detector 100 shown in FIG. 4. FIG. 6 mainly shows the difference from the arrangement shown in FIG. 4, and does not illustrate the arrangement associated with the selection circuit 132 for selecting, among the plurality of electrodes 111, the electrode 111 to supply the potential for converting the incident radiation into charges. In the arrangement shown in FIG. 6, the plurality of electrodes 111 arranged in the radiation sensor 110 are arranged to divide, into two or more regions, the surface of the radiation sensor 110 where the electrodes 111 are arranged. In this case, the plurality of electrodes 112 of the radiation sensor 110 connected to one terminal 122 of the interposer 120 are arranged at positions overlapping the different electrodes 111.

In the arrangement shown in FIG. 6 as well, similar to the arrangement shown in FIG. 4, the electrode 111 to supply the potential for converting the incident radiation into charges can be selected from the plurality of electrodes 111. While the radiation generation unit 140 emits radiation, the potential is sequentially supplied to the respective electrodes 111, thereby reading out signals from the plurality of pixels arranged in the radiation sensor 110. For example, the irradiation control unit 141 of the radiation detection system 200 may control the radiation generation unit 140 to irradiate, with radiation, a region corresponding to the electrode 111 selected by the selection circuit 132 from the plurality of electrodes 111 and supplied with the potential.

Figure 7:
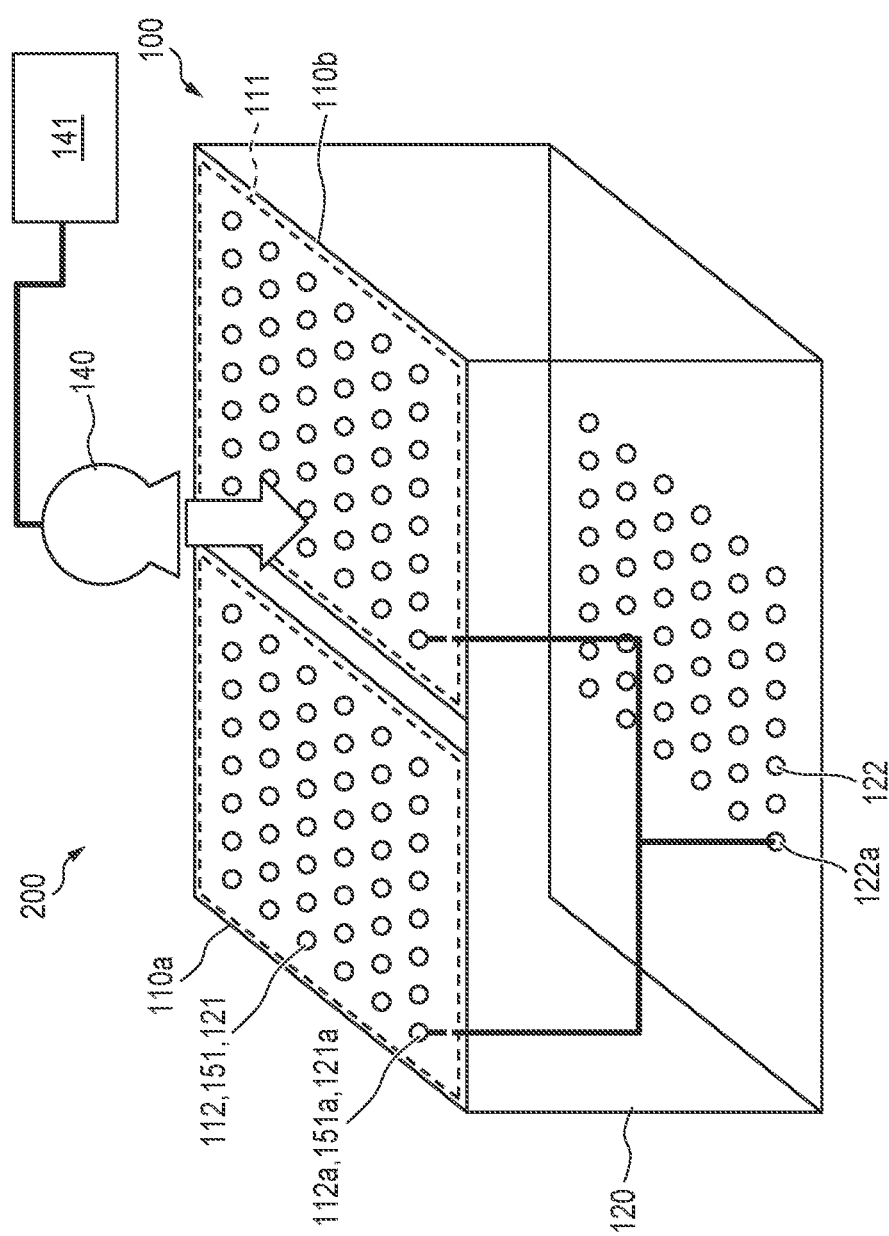
FIG. 7 is a view showing a modification of the radiation detection system shown in FIG. 4.

FIG. 7 is a view showing a modification of the radiation detection system 200 and the radiation detector 100 shown in FIG. 4 or 6. FIG. 7 mainly shows the difference from the arrangements shown in FIGS. 4 and 6, and does not illustrate the arrangement associated with the selection circuit 132 for selecting, among the plurality of electrodes 111, the electrode 111 to supply the potential for converting the incident radiation into charges. In the arrangement shown in FIG. 7, the plurality of radiation sensors 110 are arranged in the radiation detector 100, and each of the plurality of terminals 122 is connected to two or more terminals 121, among the plurality of terminals 121, respectively connected to the different radiation sensors 110. FIG. 7 shows an example in which two radiation sensors 110a and 110b are connected to the one interposer 120 but three or more radiation sensors 110 may be connected.

In the arrangement shown in FIG. 7, the electrodes 111 arranged on the radiation sensors 110a and 110b have an integrated structure for each radiation sensor 110. It can thus be said that the selection circuit 132 selects the radiation sensor 110 to supply the potential for converting the incident radiation into charges among the plurality of radiation sensors 110a and 110b. While the radiation generation unit 140 emits radiation, the selection circuit 132 sequentially selects the electrode 111 to supply the potential from the electrodes 111 arranged in the radiation sensors 110a and 110b, thereby reading out signals from the plurality of pixels arranged in the radiation sensors 110a and 110b. For example, the irradiation control unit 141 of the radiation detection system 200 may control the radiation generation unit 140 to irradiate, with radiation, the radiation sensor 110 selected by the selection circuit 132 from the plurality of radiation sensors 110a and 110b and supplied with the potential.

Figure 8:
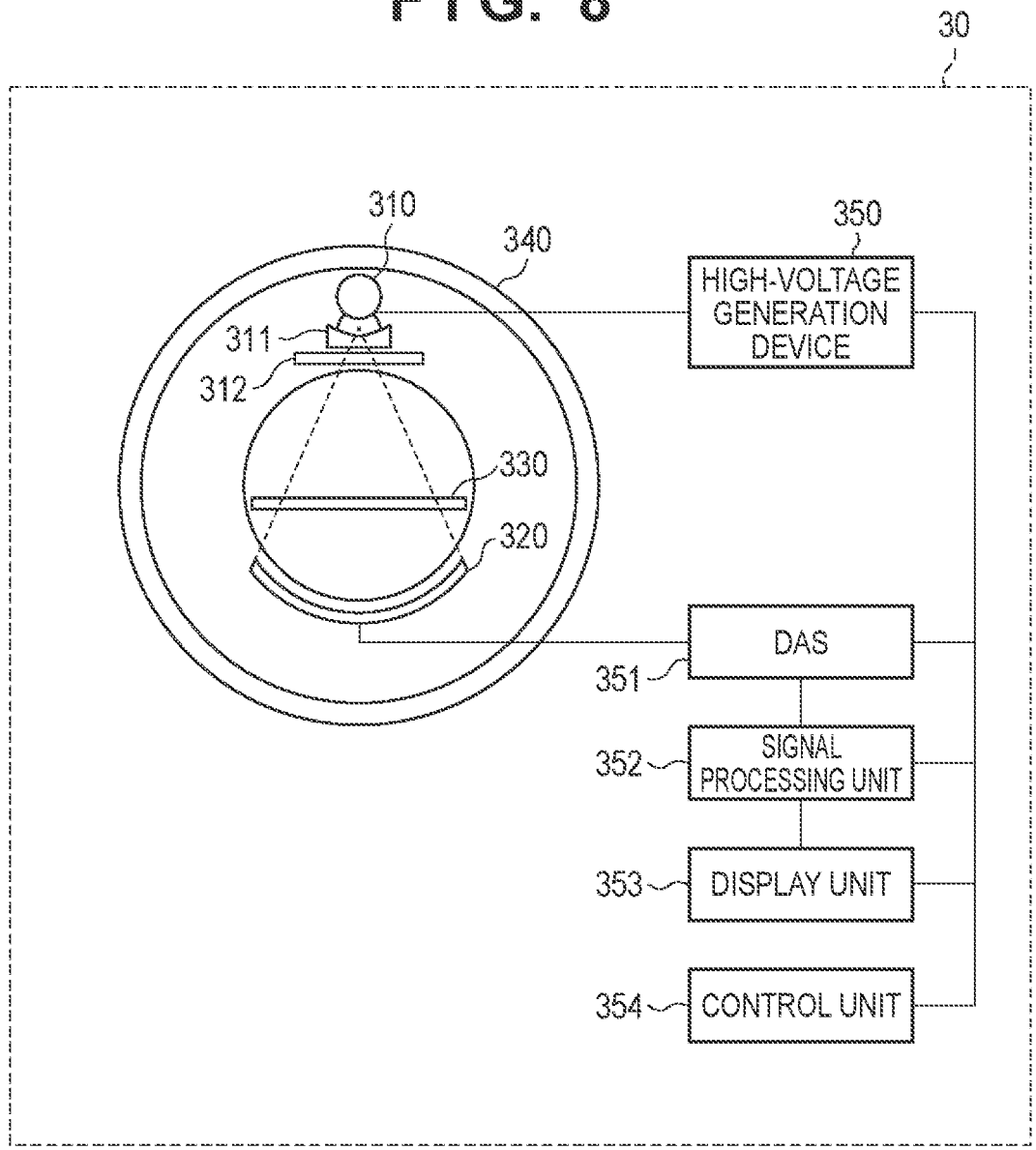
FIG. 8 is a view showing an example of the arrangement of a radiation CT apparatus using the radiation detector shown in FIG. 1.

FIG. 8 is a block diagram of a radiation CT apparatus according to this embodiment. The above-described radiation detector 100 is applicable to a detector of the radiation CT apparatus. A radiation CT apparatus 30 according to this embodiment includes a radiation generation unit 310, a wedge 311, a collimator 312, a radiation detection unit 320, a top plate 330, a rotating frame 340, a high-voltage generation device 350, a DAS (Data Acquisition System) 351, a signal processing unit 352, a display unit 353, and a control unit 354.

The radiation generation unit 310 is formed from, for example, a vacuum tube that generates X-rays. The vacuum tube of the radiation generation unit 310 is supplied with a filament current and a high voltage from the high-voltage generation device 350. When thermoelectrons are emitted from a cathode (filament) to an anode (target), X-rays are generated.

The wedge 311 is a filter that adjusts the amount of radiation emitted from the radiation generation unit 310. The wedge 311 attenuates the amount of radiation so that the radiation emitted from the radiation generation unit 310 to an object has a predetermined distribution. The collimator 312 is formed from a lead plate that narrows the irradiation range of the radiation having passed through the wedge 311. The radiation generated by the radiation generation unit 310 is formed in a cone beam shape via the collimator 312, and the object on the top plate 330 is irradiated with the radiation.

The radiation detection unit 320 is formed using the above-described radiation detector 100. The radiation detection unit 320 detects the radiation having passed through the object from the radiation generation unit 310, and outputs a signal corresponding to the amount of the radiation to the DAS 351.

The rotating frame 340 is annular, and is configured to be rotatable. The radiation generation unit 310 (the wedge 311 and the collimator 312) and the radiation detection unit 320 are arranged to face each other in the rotating frame 340. The radiation generation unit 310 and the radiation detection unit 320 can rotate together with the rotating frame 340.

The high-voltage generation device 350 includes a boosting circuit, and outputs a high voltage to the radiation generation unit 310. The DAS 351 includes an amplification circuit and an A/D conversion circuit, and outputs, as digital data, a signal from the radiation detection unit 320 to the signal processing unit 352.

The signal processing unit 352 includes a CPU (Central Processing Unit), a ROM (Read Only Memory), and a RAM (Random Access Memory), and can execute image processing and the like for the digital data. The display unit 353 includes a flat display device, and can display a radiation image. The control unit 354 includes a CPU, a ROM, and a RAM, and controls the operation of the overall radiation CT apparatus 30.

According to the present invention, there can be provided a technique advantageous in suppressing an increase in the size of the radiation detector.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-034934, filed Mar. 7, 2023, which is hereby incorporated by reference herein in its entirety.

What is claimed is:

1. A radiation detector comprising:
   a radiation sensor obtained by arranging, on a semiconductor substrate configured to convert incident radiation into charges, a plurality of pixels each including a first electrode;
   an integrated circuit configured to process a signal output from the radiation sensor; and
   an interposer configured to electrically connect the radiation sensor and the integrated circuit, wherein
   the interposer comprises a plurality of first terminals arranged on a first surface of the interposer facing the radiation sensor and electrically connected to the first electrodes of the plurality of pixels, and a plurality of second terminals arranged on a second surface of the interposer facing the integrated circuit and connected to the integrated circuit,
   each of the plurality of first terminals is connected to one second terminal among the plurality of second terminals,
   the number of the plurality of second terminals is smaller than the number of the plurality of first terminals,
   the semiconductor substrate comprises a third surface which faces the interposer and on which the first electrodes of the plurality of pixels are arranged, and a fourth surface on an opposite side of the third surface, on which a plurality of second electrodes are arranged, and
   the radiation detector further comprises a selection circuit configured to select, from the plurality of second electrodes, the second electrode to supply a potential for converting the incident radiation into charges.

2. The detector according to claim 1, wherein the selection circuit is configured to supply the potential to one second electrode among the plurality of second electrodes, and then supply the potential to another second electrode among the plurality of second electrodes.

3. The detector according to claim 2, wherein
   the first electrodes of the plurality of pixels are arranged to form rows and columns,
   the plurality of first terminals include a plurality of third terminals each connected to at least two first electrodes arranged in a row direction among the first electrodes of the plurality of pixels,
   the plurality of third terminals are connected to one second terminal among the plurality of second terminals, and
   in orthogonal projection to the fourth surface, the at least two first electrodes are arranged to overlap different second electrodes among the plurality of second electrodes.

4. The detector according to claim 3, wherein
   the plurality of third terminals are connected to first electrodes forming one row among the first electrodes of the plurality of pixels, and
   in orthogonal projection to the fourth surface, the plurality of second electrodes are arranged to overlap first electrodes forming one column among the first electrodes of the plurality of pixels.

5. The detector according to claim 1, wherein each of the plurality of second terminals is connected to at least two first terminals among the plurality of first terminals.

6. The detector according to claim 1, wherein the semiconductor substrate is a single crystal substrate made of cadmium zinc telluride.

7. The detector according to claim 1, wherein the semiconductor substrate is a single crystal substrate made of cadmium telluride.

8. The detector according to claim 1, wherein the semiconductor substrate is a single crystal substrate made of one of lead iodide, mercury iodide, bismuth iodide, and thallium bromide.

9. The detector according to claim 1, wherein
   the first electrodes of the plurality of pixels are arranged to form rows and columns,
   the plurality of first terminals include a plurality of third terminals each connected to at least two first electrodes arranged in a row direction among the first electrodes of the plurality of pixels,
   the plurality of third terminals are connected to one second terminal among the plurality of second terminals, and
   in orthogonal projection to the fourth surface, the at least two first electrodes are arranged to overlap different second electrodes among the plurality of second electrodes.

10. The detector according to claim 9, wherein
    the plurality of third terminals are connected to first electrodes forming one row among the first electrodes of the plurality of pixels, and
    in orthogonal projection to the fourth surface, the plurality of second electrodes are arranged to overlap first electrodes forming one column among the first electrodes of the plurality of pixels.

11. The detector according to claim 9, wherein the plurality of second electrodes are arranged to divide the fourth surface into at least two regions.

12. The detector according to claim 1, wherein
a plurality of radiation sensors are arranged in the radiation detector, and
each of the plurality of second terminals is connected to at least two first terminals connected to the different radiation sensors among the plurality of first terminals.

13. A radiation detection system comprising:
the radiation detector according to claim 1;
a radiation generation unit configured to irradiate the radiation detector with radiation; and
an irradiation controller configured to control the radiation generation unit, wherein
the irradiation controller is configured to control the radiation generation unit to irradiate, with the radiation, a position corresponding to a second electrode selected by a selection circuit from a plurality of second electrodes and supplied with a potential.

14. A radiation CT apparatus comprising:
the radiation detector according to claim 1;
a radiation generation unit configured to irradiate the radiation detector with radiation, and
a signal processor configured to process a signal output from the radiation detector.

* * * * *